(12) United States Patent
Ebiike et al.

(10) Patent No.: US 9,059,086 B2
(45) Date of Patent: Jun. 16, 2015

(54) METHOD OF MANUFACTURING SEMICONDUCTOR DEVICE

(75) Inventors: Yuji Ebiike, Tokyo (JP); Takahiro Nakatani, Tokyo (JP); Hiroshi Watanabe, Tokyo (JP); Yoshio Fujii, Tokyo (JP); Sunao Aya, Tokyo (JP); Yoshiyuki Nakaki, Tokyo (JP); Tsuyoshi Kawakami, Tokyo (JP); Shuhei Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/979,564

(22) PCT Filed: Jun. 9, 2011

(86) PCT No.: PCT/JP2011/063232
§ 371 (c)(1),
(2), (4) Date: Jul. 12, 2013

(87) PCT Pub. No.: WO2012/096010
PCT Pub. Date: Jul. 19, 2012

(65) Prior Publication Data
US 2013/0288467 A1    Oct. 31, 2013

(30) Foreign Application Priority Data

Jan. 14, 2011  (JP) ................................ 2011-005496
Feb. 7, 2011   (JP) ................................ 2011-023519

(51) Int. Cl.
*H01L 21/265*    (2006.01)
*H01L 21/76*     (2006.01)
(Continued)

(52) U.S. Cl.
CPC .......... *H01L 21/266* (2013.01); *H01L 29/0619* (2013.01); *H01L 29/0661* (2013.01);
(Continued)

(58) Field of Classification Search
CPC .............. H01L 29/66068; H01L 29/0619; H01L 29/0661; H01L 29/1608; H01L 29/6606; H01L 21/266; H01L 21/26586; H01L 21/0465; H01L 23/544; H01L 2223/54426; H01L 2223/54443
USPC .......... 438/523, 445, 531, 551; 257/E21.231, 257/E21.235; 430/149, 155
See application file for complete search history.

(56) References Cited

U.S. PATENT DOCUMENTS 6,707,100 B2    3/2004  Gajda
6,855,601 B2    2/2005  Gajda
(Continued)

FOREIGN PATENT DOCUMENTS

JP    63 261836    10/1988
JP    9 162137     6/1997
(Continued)

OTHER PUBLICATIONS

International Preliminary Report on Patentability with Written Opinion issued on Jul. 25, 2013 in PCT JP2011/063232 filed on Jun. 9, 2011.

(Continued)

*Primary Examiner* — Julio J Maldonado
*Assistant Examiner* — Moazzam Hossain
(74) *Attorney, Agent, or Firm* — Oblon, McClelland, Maier & Neustadt, L.L.P.

(57) ABSTRACT

A semiconductor device capable of suppressing generation of a high electric field and preventing a dielectric breakdown from occurring, and a method of manufacturing the same. The method of manufacturing a semiconductor device includes (a) preparing an n+ substrate to be a ground constituted by a silicon carbide semiconductor of a first conductivity type, (b) forming a recess structure surrounding an element region on the n+ substrate by using a resist pattern, and (d) forming a guard ring injection layer to be an impurity layer of a second conductivity type in a recess bottom surface and a recess side surface in the recess structure by impurity injection through the resist pattern, and a corner portion of the recess structure is covered with the impurity layer.

12 Claims, 11 Drawing Sheets

(51) Int. Cl.
*H01L 21/266* (2006.01)
*H01L 29/06* (2006.01)
*H01L 29/16* (2006.01)
*H01L 29/66* (2006.01)
*H01L 21/04* (2006.01)
*H01L 23/544* (2006.01)

(52) U.S. Cl.
CPC ........ *H01L29/1608* (2013.01); *H01L 29/6606* (2013.01); *H01L 29/66068* (2013.01); *H01L 21/0465* (2013.01); *H01L 23/544* (2013.01); *H01L 2223/54426* (2013.01); *H01L 2223/54453* (2013.01); *H01L 2924/0002* (2013.01)

(56) References Cited

U.S. PATENT DOCUMENTS

| | | | |
|---|---|---|---|
| 7,381,992 B2 * | 6/2008 | Ryu | 257/77 |
| 7,821,028 B2 | 10/2010 | Koenig | |
| 8,222,649 B2 | 7/2012 | Miura et al. | |
| 8,232,558 B2 * | 7/2012 | Zhang et al. | 257/77 |
| 8,304,901 B2 | 11/2012 | Watanabe et al. | |
| 2003/0020102 A1 | 1/2003 | Gajda | |
| 2004/0124461 A1 | 7/2004 | Gajda | |
| 2006/0226504 A1 * | 10/2006 | Hatakeyama et al. | 257/472 |
| 2007/0093045 A1 * | 4/2007 | Yamaguchi et al. | 438/590 |
| 2007/0221953 A1 | 9/2007 | Sakamoto | |
| 2009/0068826 A1 * | 3/2009 | Taniguchi | 438/585 |
| 2011/0095301 A1 | 4/2011 | Tarui | |

FOREIGN PATENT DOCUMENTS

| | | |
|---|---|---|
| JP | 9-266309 | 10/1997 |
| JP | 10 12861 | 1/1998 |
| JP | 2003-173985 | 6/2003 |
| JP | 2003 332588 | 11/2003 |
| JP | 2004-537172 | 12/2004 |
| JP | 2005 116681 | 4/2005 |
| JP | 2005 303032 | 10/2005 |
| JP | 2007-134423 | 5/2007 |
| JP | 2007 288172 | 11/2007 |
| JP | 2008 311571 | 12/2008 |
| JP | 2009 152609 | 7/2009 |
| JP | 2011 96757 | 5/2011 |
| WO | 2007 091360 | 8/2007 |
| WO | 2009 116444 | 9/2009 |

OTHER PUBLICATIONS

Japanese Office Action issued Oct. 29, 2013, in Japan Patent Application No. 2012-552619 (with English translation).

Singh, R. et al., Planar terminations in 4H-Sic Schottky Diodes with Low Leakage and High Yields, ISPSD '97 1977 IEEE International Symposium on Power Semiconductor Devices and ICs, pp. 157-160, (May 26, 1997).

International Search Report Issued Jul. 19, 2011 in PCT/JP11/063232 Filed Jun. 9, 2011.

* cited by examiner

F I G . 1
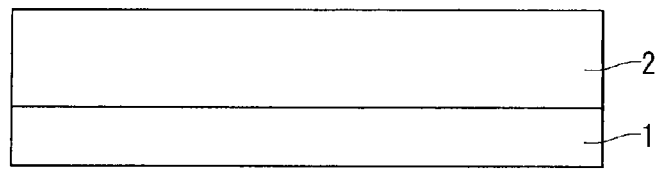
F I G . 2
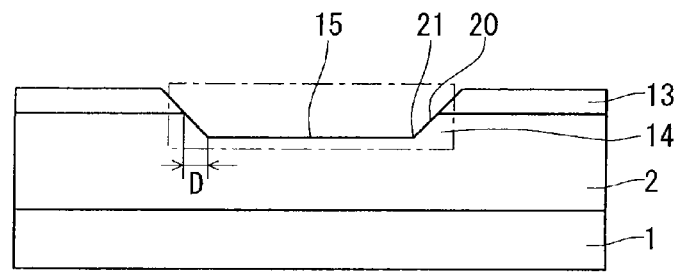
F I G . 3
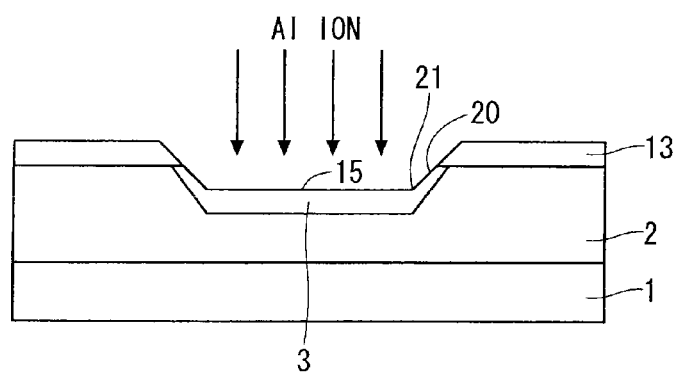

F I G. 8
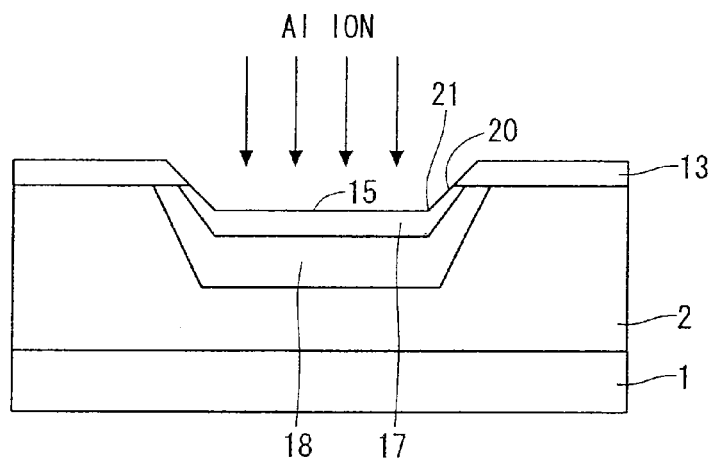
F I G. 9
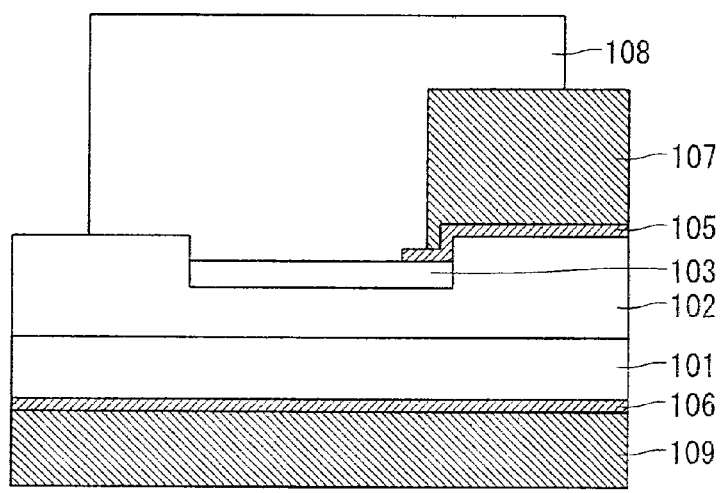

F I G . 1 0
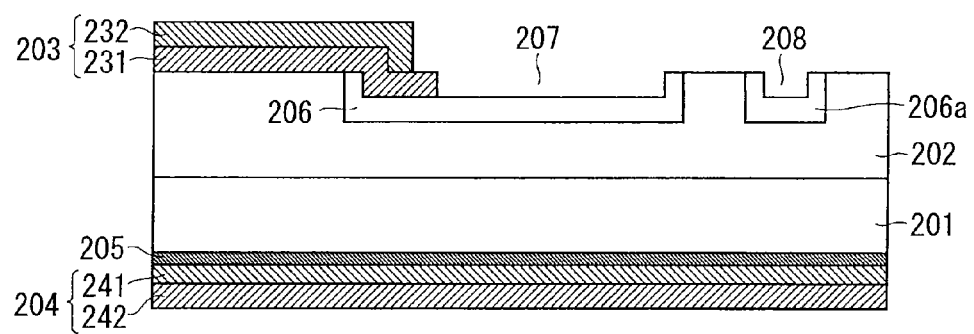
F I G . 1 1
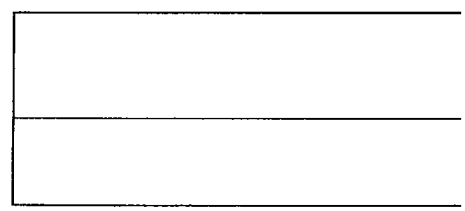

METHOD OF MANUFACTURING SEMICONDUCTOR DEVICE

TECHNICAL FIELD

The present invention relates to a method of manufacturing a semiconductor device and, more particularly to a method of manufacturing a termination structure.

BACKGROUND ART

As a next generation switching element capable of implementing a high withstand voltage, a low loss, and a high heat resistance, a semiconductor element using silicon carbide (SiC) is prospected and application to a power semiconductor device such as an inverter is expected.

However, an SiC semiconductor device has a large number of problems to be solved. One of them is deterioration in a withstand voltage characteristic of the semiconductor device which is caused by electric field concentration in a termination portion of the semiconductor device (for example, an end of a Schottky electrode in a Schottky barrier diode or an end of a pn junction in a pn diode or an MOSFET (Metal Oxide Semiconductor Field Effect Transistor)).

A typical example of the termination structure which relieves an electric field generated in the termination portion of the semiconductor device includes a guard ring structure, a JTE (Junction Termination Extension) structure, an FLR (Field Limiting Ring) structure and the like. All of them are impurity diffusion layers formed to surround an element region. In general, the JTE structure is provided in order to reduce a surface electric field and has a structure in which an impurity concentration is stepwise reduced outward from the termination portion of the semiconductor device. On the other hand, the FLR structure is constituted by a plurality of impurity diffusion layers having an equal concentration.

For example, the following Patent Document 1 discloses a termination structure in which a guard ring and JTE are combined with each other. In the termination structure disclosed in the Patent Document 1, the JTE having a lower impurity concentration than in the guard ring is provided on an outside of the guard ring. In the Patent Document 1, moreover, there is proposed the technique for forming the guard ring and the JTE under a recess structure provided on a surface of a semiconductor layer, thereby increasing a distance between bottom ends of the guard ring and the JTE in which electric field concentration is apt to occur and the surface of the semiconductor layer and thus relieving an electric field on the surface of the semiconductor layer still more.

PRIOR ART DOCUMENT

Patent Document

Patent Document 1: International Publication No. WO 2009/116444

SUMMARY OF THE INVENTION

Problems to be Solved by the Invention

As described above, in the semiconductor device according to the background art, two types of injecting conditions of the guard ring/JTE are used to implement a withstand voltage structure.

In order to implement the guard ring/JTE structure on the two types of injecting conditions, steps of forming masks for injecting impurities in corresponding positions are required respectively. In order to form their masks, moreover, it is necessary to further form alignment marks to be references for aligning the positions of the respective masks at a previous step thereof. The alignment mark is formed by etching the surface of the semiconductor.

As described above, in the semiconductor device according to the background art, at least three masks (for forming an alignment mark, forming a guard ring, and forming JTE) are required, and furthermore, the impurities are to be injected on different conditions. For this reason, the number of steps is increased, and furthermore, there is caused a problem of increase in a variation, deterioration in a yield, increase in a cost or the like.

As a method of improving these problems, it is proposed to provide a single mask. In other words, first of all, the termination structure is set to have only the guard ring or to have an FLR (Field Limiting Ring), and a single injecting step is provided. In addition, the step of forming an alignment mark and the step of forming the injecting mask are set to be common steps so that the termination structure can be formed by a single mask.

In these semiconductor devices, a single type of injecting condition is applied and a recess structure is thus provided with the termination structure in which impurities are injected at one concentration.

In the case of an SiC device, the injected impurities are hardly diffused but activated. Accordingly, in the case where there is applied one type of injecting condition that cannot be optimized as compared with two types of injecting conditions in the guard ring/JTE structure in addition to the case of only the guard ring structure, an impurity layer having a high concentration is particularly formed in the immediate vicinity of the recess structure. Moreover, the guard ring is formed in a relatively high impurity concentration in order to ensure a withstand voltage characteristic of an element.

Consequently, there is a problem in that growth of a depletion layer in the impurity layer is lessened and a high electric field is thus apt to be generated in the case where a high voltage is applied to a cathode.

In particular, there is a problem in that a dielectric breakdown is caused when a high electric field is generated in a corner portion of the recess structure and exceeds a breakdown strength of a polyimide film to be a surface sealing material, for example. In some cases, moreover, the diffusion of the injected impurities is insufficient and the corner portion of the recess structure is not covered with the injection layer.

The present invention has been made to solve the problems and an object thereof is to provide a semiconductor device capable of suppressing generation of a high electric field and preventing a dielectric breakdown from occurring, and a method of manufacturing the same.

Means for Solving the Problems

The method of manufacturing a semiconductor device according to the present invention includes the steps of (a) preparing a ground constituted by a silicon carbide semiconductor of a first conductivity type, (b) forming a recess structure surrounding an element region on the ground by using a resist pattern, (c) carrying out a shrinking treatment for the resist pattern after the step (b), and (d) forming an impurity layer of a second conductivity type in a recess bottom surface and a recess side surface in the recess structure by impurity injection through the resist pattern after the step (c), and a corner portion of the recess structure is covered with the impurity layer.

The method of manufacturing a semiconductor device according to the present invention includes the steps of (a) preparing a ground constituted by a silicon carbide semiconductor of a first conductivity type, (b) forming a recess structure surrounding an element region on the ground by using a resist pattern, (c) carrying out a shrinking treatment for the resist pattern after the step (b), and (d) forming an impurity layer of a second conductivity type in a recess bottom surface and a recess side surface in the recess structure by impurity injection through the resist pattern after the step (c), and a corner portion of the recess structure is covered with the impurity layer. Consequently, also in the case where the silicon carbide semiconductor that hardly causes the diffusion of the impurities to be injected is used, it is possible to implement a structure in which the corner portion of the recess structure is sufficiently covered with the impurity layer. Therefore, it is possible to implement maintenance of a stable withstand voltage in the semiconductor device.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a sectional view showing a process for manufacturing a semiconductor device according to a first embodiment of the present invention.

FIG. 2 is a sectional view showing the process for manufacturing a semiconductor device according to the first embodiment of the present invention.

FIG. 3 is a sectional view showing the process for manufacturing a semiconductor device according to the first embodiment of the present invention.

FIG. 8 is a sectional view showing a process for manufacturing a semiconductor device according to a third embodiment of the present invention.

FIG. 9 is a sectional view showing a structure of the semiconductor device to be a premise technique according to the present invention.

FIG. 10 is a view showing a structure of a termination region of a semiconductor device according to a fourth embodiment of the present invention.

FIG. 11 is a view showing a process for manufacturing a semiconductor device according to the fourth embodiment of the present invention.

EMBODIMENT FOR CARRYING OUT THE INVENTION

A. First Embodiment

Figure 4:
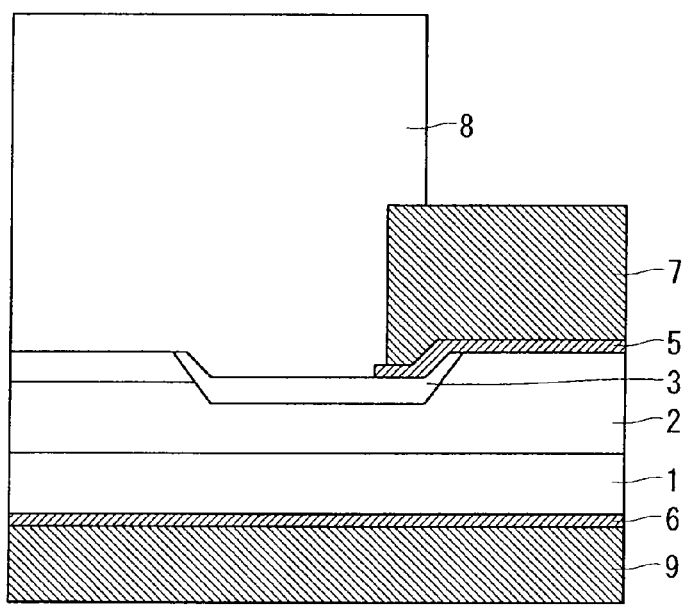
FIG. 4 is a sectional view showing a structure of the semiconductor device according to the first embodiment of the present invention.

For energy saving of a power electronics apparatus such as an inverter, it is necessary to reduce a loss of a semiconductor switching element such as an insulated gate bipolar transistor (IGBT) or a metal oxide semiconductor field effect transistor (MOSFET).

The loss is determined by an ON resistance of the element. In the present invention, therefore, silicon carbide (SiC) is used to reduce the ON resistance.

In the case where a recess structure is applied to a termination structure, a semiconductor device as shown in FIG. 9 is formed.

More specifically, an n-type epitaxial layer 102 is formed on an n+ substrate 101, and a metal layer 106, and furthermore, a back electrode 109 are formed on a back surface of the n+ substrate 101.

Moreover, the n-type epitaxial layer 102 has a structure (a recess structure) obtained by digging a guard ring injection layer 103 on the n-type epitaxial layer 102. Furthermore, a metal layer 105 is formed with a part of the guard ring injection layer 103 covered.

In addition, a surface electrode 107 is formed on the metal layer 105, and a polyimide 108 is formed over the metal layer 105, the guard ring injection layer 103, and the n-type epitaxial layer 102.

The semiconductor device includes a termination structure obtained by injecting impurities at one concentration into the recess structure. The recess structure is obtained by etching in formation of an alignment mark which is not shown.

In the case of an SiC device, the injected impurities are hardly diffused but activated. Accordingly, an impurity layer having a high concentration is formed in the immediate vicinity of the recess structure. Moreover, the guard ring having a relatively high impurity concentration is formed in order to ensure a withstand voltage characteristic of an element.

Consequently, there is a problem in that growth of a depletion layer in the impurity layer is lessened and a high electric field is thus apt to be generated in the case where a high voltage is applied to a cathode.

In particular, there is a problem in that a dielectric breakdown is caused when a high electric field is generated in a corner portion on a bottom surface of a recess and exceeds a breakdown strength of a polyimide film, for example. In some cases, moreover, the diffusion of the injected impurities is insufficient and the corner portion of the recess structure cannot be covered with the injection layer.

Embodiments according to the present invention which will be described below can solve the problems described above.

A-1. Manufacturing Process

FIGS. 1 to 4 are sectional views showing a process for manufacturing a semiconductor device using SiC (herein, there is used an SiC Schottky barrier diode which will be hereinafter referred to as SiC-SBD). The manufacturing process will be described below.

First of all, as shown in FIG. 1, an n-type epitaxial layer 2 is formed on a surface of an n-type SiC substrate having a low resistance (an n+ substrate 1 to be a ground) by a chemical vapor deposition (CVD) method. A concentration of impurities of the n-type epitaxial layer 2 is approximately $5 \times 10^{15}$ cm$^{-3}$, for example.

Next, a mark is formed on the n-type epitaxial layer 2 to implement an alignment at a photomechanical step (not shown). An alignment mark is formed by patterning a resist in a desirable region and etching the n-type epitaxial layer 2 through reactive ion etching (RIE), for example. Note that, in the first embodiment, the formation of the alignment mark and the termination structure forming step are carried out by means of the same mask. By carrying out the formation of the alignment mark and that of the termination structure by means of the same mask, it is possible to reduce the number of the steps.

First of all, a resist pattern is formed. For example, a positive resist material using a novolac resin as a base resin or the like is used to carry out a heat treatment for 60 seconds at a temperature of 110° C.

Furthermore, a developing treatment is carried out. For a developing condition, a tetramethylammonium hydroxide 2.8 wt % solution is used as an alkaline developing solution, for example, and a developing time is set to be 100 seconds. After the development, washing is performed with pure water for 60 seconds.

A resist pattern 13 is formed through these steps. The resist pattern 13 thus formed has a side wall angle at an end thereof (an angle formed between a side surface of the resist pattern 13 and a surface of the n+ substrate 1 of the SiC) which is approximately 82 degrees, and takes a taper shape at the end.

The resist pattern 13 is used to carry out etching over the n-type epitaxial layer 2 (see FIG. 2). In the case where the etching is carried out with the RIE as an etching method, for example, sulfur hexafluoride (SF$_6$) is used as an etching gas, a gas pressure is set to be 1 Pa, a flow rate is set to be approximately 50 sccm, a high frequency power is set to be approximately 700 to 900 W and a substrate bias power is set to be approximately 50 to 70 W as etching conditions. A selection ratio of the etching is set to be 0.5, for example.

Since the resist pattern 13 takes the taper shape at the end (see FIG. 2), the end of the resist pattern 13 is easily etched. Therefore, it is possible to increase a quantity of retreat at the end of the resist pattern 13 and to form a recess structure 14 taking a taper shape is formed in the n+ substrate 1 of the SiC. More specifically, a recess side surface 20 of the recess structure 14 is inclined and a corner portion 21 in the recess structure 14 (a boundary between a recess bottom surface 15 and the recess side surface 20) is set to have an obtuse angle. Since the recess structure 14 is obtained by forming the termination structure through the injection of an impurity layer which will be described below, it is formed to surround an element region.

Here, a taper width D shown in FIG. 2 is desirably equal to or greater than 0.2 μm and a recess depth is desirably equal to or greater than 0.1 μm. Moreover, the corner portion 21 shown in FIG. 2 is desirably formed to have a curvature, and furthermore, a radius of curvature thereof is desirably equal to or greater than 0.1 μm. As a method of possessing the curvature, it is preferable to perform sacrificial oxidation over a surface after carrying out ion implantation which will be described below, for example.

Next, in order to relieve electric field concentration into a device end, thereby ensuring a kV class withstand voltage stably, there is formed a termination structure surrounding an element region in which a semiconductor element is to be formed (see FIG. 3). The termination structure is formed by injecting impurities through the resist pattern 13, and Al ions are implanted to form a p-type guard ring injection layer 3, for example. The Al ions are implanted at a room temperature in an energy of 40 to 800 keV in order to set an implantation quantity of $1 \times 10^{17}$ to $8 \times 10^{17}$ cm$^{-3}$ and an implantation depth of 0.6 to 1.0 μm as ion implantation conditions, for example. Note that, although not shown in FIG. 3, a plurality of guard ring injection layers 3 may be formed to surround the element region.

In the first embodiment, the recess side surface 20 takes a proper taper shape as shown in FIG. 3. For this reason, also in the case where there is used the SiC that hardly causes the diffusion of impurities, for example, it is possible to implement a structure in which the corner portion 21 of the recess structure 14 is sufficiently covered with the guard ring injection layer 3.

By setting the corner portion 21 to have an obtuse angle, moreover, it is possible to prevent the electric field concentration into the corner portion 21. As a result, it is possible to implement the maintenance of a stable withstand voltage in the semiconductor device.

Subsequently, a semiconductor device 100 having a sectional structure as shown in FIG. 4 is completed through the same manufacturing process as that in the background art.

More specifically, a metal layer 6, and furthermore, a back electrode 9 are formed on a back surface of the n+ substrate 1.

Moreover, the resist pattern 13 is removed and the guard ring injection layer 3 is partially covered so that a metal layer 5 is formed.

Furthermore, a surface electrode 7 is formed on the metal layer 5 and a polyimide 8 is formed over the metal layer 5, the guard ring injection layer 3, and the n-type epitaxial layer 2.

From the foregoing, according to the method of manufacturing a semiconductor device in accordance with the present embodiment, there is employed the structure in which the corner portion 21 of the recess structure 14 to be the termination structure is sufficiently surrounded by the guard ring injection layer 3. Therefore, a high electric field is generated with difficulty. Moreover, the corner portion 21 is formed to have an obtuse angle so that the electric field concentration of the corner portion 21 can be relieved. Furthermore, it is possible to ensure a stable withstand voltage.

A-2. Effects

According to the embodiment of the present invention, the method of manufacturing a semiconductor device includes the steps of (a) preparing an n+ substrate 1 to be a ground constituted by a silicon carbide semiconductor of a first conductivity type, (b) forming a recess structure 14 surrounding an element region on the n+ substrate 1 by using a resist pattern 13, and (d) forming a guard ring injection layer 3 to be an impurity layer of a second conductivity type in a recess bottom surface 15 and a recess side surface 20 in the recess structure 14 by impurity injection through the resist pattern 13, and a corner portion of the recess structure 14 is covered with the impurity layer (3). Also in the case where there is used the SiC that hardly causes the diffusion of the impurities to be injected, consequently, it is possible to implement a structure in which the corner portion 21 is sufficiently covered with the guard ring injection layer 3. Accordingly, it is possible to implement the maintenance of a stable withstand voltage in the semiconductor device.

Moreover, according to the embodiment of the present invention, in the method of manufacturing a semiconductor device, the step (b) of forming the recess structure 14 surrounding an element region on the n+ substrate 1 by using the resist pattern 13 is a step of forming the recess structure 14 taking a taper shape on the recess side surface 20 by using the resist pattern 13 taking a taper shape at an end. Consequently, the corner portion 21 of the recess structure 14 is set to have an obtuse angle. Thus, it is possible to prevent electric field concentration into the corner portion 21.

Furthermore, according to the embodiment of the present invention, in the method of manufacturing a semiconductor device, the step (b) of forming the recess structure 14 surrounding an element region on the n+ substrate 1 by using the resist pattern 13 is a step of forming the recess structure 14 in which a depth of the recess is equal to or greater than 0.1 µm and a width of the taper shape is equal to or greater than 0.2 µm. Consequently, it is possible to implement a stable withstand voltage.

Moreover, according to the embodiment of the present invention, in the method of manufacturing a semiconductor device, the step (b) of forming the recess structure 14 surrounding an element region on the n+ substrate 1 by using the resist pattern 13 is a step of forming the recess structure 14 having the corner portion 21 in which a radius of curvature is equal to or greater than 0.1 µm. Consequently, it is possible to implement a stable withstand voltage.

B. Second Embodiment

B-1. Manufacturing Process

Although the guard ring injection layer 3 is formed as the termination structure in the first embodiment, another withstand voltage structure, for example, a field limiting ring (an FLR injection layer 16) may be formed.

The formation of the epitaxial layer 2 in FIG. 2 is carried out in the same manner, and an alignment mark and a termination structure are then formed by using a resist pattern 13.

Figure 5:
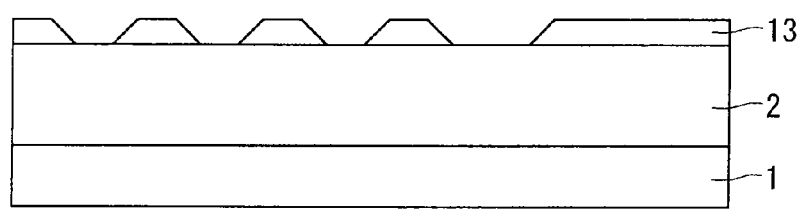
FIG. 5 is a sectional view showing a process for manufacturing a semiconductor device according to a second embodiment of the present invention.

FIG. 5 shows a situation of patterning for a resist in the termination structure according to a second embodiment of the present invention. At this time, a resist is also patterned onto a portion in which the alignment mark is to be formed.

In the same manner as in the first embodiment, an end of the resist pattern 13 is formed to take a taper shape. In addition, a selection ratio of etching is reduced to carry out RIE in such a manner that a recess side surface 20 of a recess structure 14 takes a taper shape.

Figure 6:
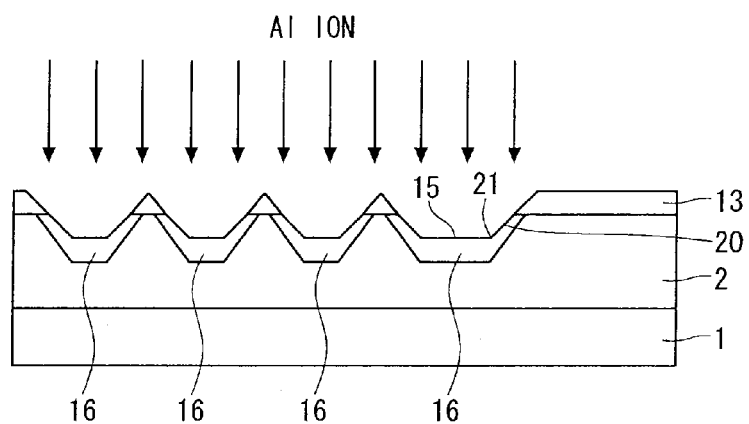
FIG. 6 is a sectional view showing the process for manufacturing a semiconductor device according to the second embodiment of the present invention.

As shown in FIG. 6, next, the FLR injection layer 16 is formed by implanting Al ions at a room temperature in an energy of 40 to 800 keV in order to set an implantation quantity of $1 \times 10^{17}$ to $8 \times 10^{17}$ cm$^{-3}$ and an implantation depth of 0.6 to 1.0 µm, for example.

In the second embodiment, the recess side surface 20 takes a proper taper shape as shown in FIG. 6. Also in the case where there is used SiC that hardly causes the diffusion of impurities, therefore, it is possible to implement such a shape that a corner portion 21 of the recess structure 14 is sufficiently covered with the FLR injection layer 16.

By setting the corner portion 21 to have an obtuse angle, moreover, it is possible to prevent electric field concentration into the corner portion 21. As a result, it is possible to implement the maintenance of a stable withstand voltage in the semiconductor device.

Figure 7:
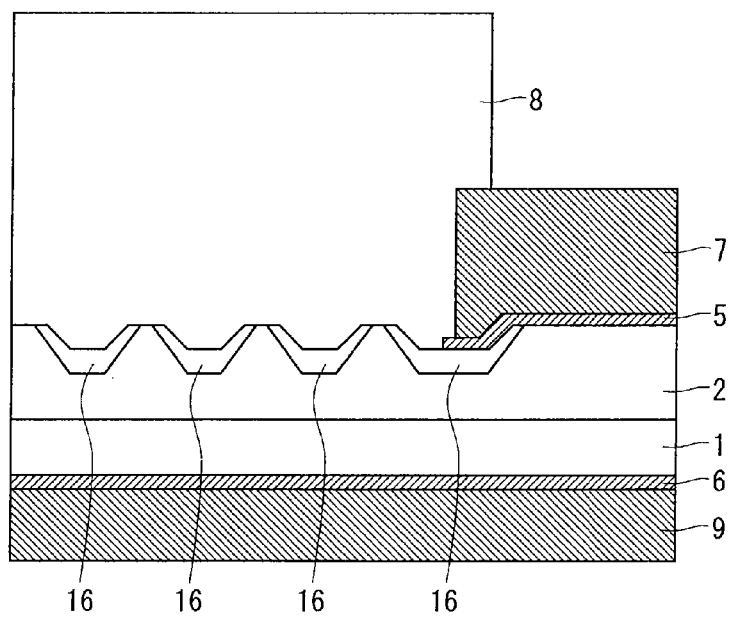
FIG. 7 is a sectional view showing a structure of the semiconductor device according to the second embodiment of the present invention.

Subsequently, a semiconductor device 200 having a sectional structure as shown in FIG. 7 is completed through the same manufacturing process as that in the background art.

More specifically, a metal layer 6, and furthermore, a back electrode 9 are formed on a back surface of an n+ substrate 1.

Moreover, the resist pattern 13 is removed and the FLR injection layer 16 is partially covered so that a metal layer 5 is formed.

Furthermore, a surface electrode 7 is formed on the metal layer 5 and a polyimide 8 is formed over the metal layer 5, the FLR injection layer 16, and the n-type epitaxial layer 2.

From the foregoing, according to the method of manufacturing a semiconductor device in accordance with the present embodiment, there is employed the structure in which the corner portion 21 of the recess structure 14 is sufficiently covered with the FLR injection layer 16 as shown in FIG. 7. Consequently, a high electric field is generated with difficulty. Moreover, the corner portion 21 is formed to have an obtuse angle. Therefore, it is possible to prevent the electric field concentration.

Although the number of the FLR injection layers 16 is four (four circles) in FIG. 7, the present invention is not restricted to the number. If a desirable withstand voltage can be ensured, it is preferable to decrease the number of the FLR injection layers 16 in order to reduce an element size.

To the contrary, a large number of FLR injection layers 16 are required for a high withstand voltage. In that case, there is a fear that the element size might be increased. In the semiconductor device according to the present invention, however, taper etching for the resist pattern 13 is utilized. For this reason, it is possible to carry out patterning over slits having a small interval which is conventionally hard to implement. In other words, it is possible to reduce a formation interval between the FLR injection layers 16. Therefore, it is possible to suppress increase in the size of the element.

Although FIG. 7 shows an equal formation interval between the FLR injection layers 16, moreover, it is also possible to design in such a manner that the interval between the FLR injection layers 16 is increased toward an outer periphery of an element region. By the formation, an apparent impurity concentration tends to be reduced toward the outer periphery, which is suitable for obtaining a stable withstand voltage.

Note that, also in the first embodiment in which the guard ring injection layer 3 is formed, it is possible to reduce the formation interval or the design in such a manner that the formation interval is increased toward the outer periphery. Thus, the same effects can be produced.

B-2. Effects

According to the embodiment of the present invention, in the method of manufacturing a semiconductor device, the step (b) of forming the recess structure 14 surrounding an element region on the n+ substrate 1 by using the resist pattern 13 is a step of forming a plurality of recess structures 14 surrounding the element region on the n+ substrate 1 by using the resist pattern 13, and the step (b) is a step of forming a plurality of recess structures 14 in such a manner that an interval between the recess structures 14 is increased toward the outer periphery of the element region. Consequently, an apparent impurity concentration tends to be reduced toward the outer periphery so that a stable withstand voltage can be obtained.

C. Third Embodiment

C-1. Manufacturing Process

The impurity injection in the termination structure according to the first or second embodiment may be carried out in such a manner that a surface of a recess structure 14 is set to have a low concentration and the concentration is gradually increased apart from the surface as shown in FIG. 8. In other words, the impurity injection in two-stages is carried out, and a low concentration impurity injection layer 17 is formed in a region in the vicinity of a recess bottom surface 15 and a recess side surface 20 in the recess structure 14 and a high concentration impurity injection layer 18 is formed on an inside thereof, that is, a surface provided apart from the surface of the recess structure 14.

If the design is carried out to have the structure, a corner portion 21 in the recess structure 14 causing electric field concentration easily has a low concentration. Therefore, the electric field concentration can be relieved, and furthermore, it is possible to expect the maintenance of a stable withstand voltage characteristic.

FIG. 8 is a view showing an application to a guard ring injection layer 3, and an application to an FLR injection layer 16 is also enabled as in the second embodiment. In this case, the number of the FLR injection layers 16 may be increased/decreased as necessary and an interval between the FLR injection layers 16 may be equal or unequal as described in the second embodiment. In addition, the present invention may be applied to the case of fourth to sixth embodiments which will be described below.

C-2. Effects

According to the embodiment of the present invention, in the method of manufacturing a semiconductor device, the step (d) of forming the guard ring injection layer 3 to be an impurity layer of a second conductivity type in a recess bottom surface 15 and a recess side surface 20 in the recess structure 14 by impurity injection through a resist pattern 13 is a step of forming an impurity layer constituted by the low concentration impurity injection layer 17 and the high concentration impurity injection layer 18 of a second conductivity type through the impurity injection in two stages. Consequently, the corner portion 21 of the recess structure 14 causing the electric field concentration easily has a low concentration. Therefore, the electric field concentration can be relieved, and furthermore, it is possible to expect the maintenance of a stable withstand voltage characteristic.

D. Fourth Embodiment

D-1. Manufacturing Process

FIG. 10 is a view showing a structure of a termination region in a semiconductor device according to a fourth embodiment. As an example, there is illustrated the structure in which a guard ring is provided as a termination structure at an end of a Schottky barrier diode formed by using a silicon carbide (SiC) semiconductor.

The semiconductor device is formed by using an epitaxial substrate including an n-type SiC substrate 201 and an n-type SiC drift layer 202 subjected to epitaxial growth thereon. An anode electrode 203 to be Schottky connected to the SiC drift layer 202 is provided on an upper surface of the SiC drift layer 202. A cathode electrode 204 to be ohmic connected to the SiC substrate 201 is provided on a lower surface of the SiC substrate 201.

In the present embodiment, a silicide layer 205 is provided between the SiC substrate 201 and the cathode electrode 204 to reduce a connection resistance therebetween. Moreover, the cathode electrode 204 is set to have a two-layer structure including an Ni layer 241 and an Au layer 242. Furthermore, the anode electrode 203 also has a two-layer structure including a titanium (Ti) layer 231 and an aluminum (Al) layer 232, and the Al layer 232 to be an upper layer functions as a pad electrode for connecting a wiring.

A guard ring 206 to be a p-type impurity region for suppressing electric field concentration under an end of the anode electrode 203 is formed in a region including a portion provided under the end of the anode electrode 203 in a surface portion of the SiC drift layer 202. As shown in FIG. 10, the guard ring 206 is formed in a lower part of a recess structure 207 provided on the SiC drift layer 202, and the end of the anode electrode 203 is extended into the recess structure 207.

By the structure, a distance between a bottom end of the guard ring 206 and a surface of the SiC drift layer 202 is increased. Therefore, an electric field in the surface portion of the SiC drift layer 202 can be relieved.

The guard ring 206 is extended to an outer edge part of the recess structure 207 in addition to a bottom part thereof. Consequently, a longitudinal sectional area of the guard ring 206 is increased so that the electric field concentration in the bottom end of the guard ring 206 can be relieved still more.

An alignment mark 208 to be used for aligning various masks is formed on the surface of the SiC drift layer 202. Referring to a method of manufacturing a semiconductor device according to the present embodiment, the same p-type impurity region 206a as the guard ring 206 is also formed in a lower part of the alignment mark 208, of which detailed description will be given later.

FIGS. 11 to 17 are views showing steps in the method of manufacturing the Schottky barrier diode and the termination structure thereof illustrated in FIG. 1. Based on these drawings, the method of manufacturing a semiconductor device according to the present embodiment will be described below.

First of all, an n-type (n$^+$-type) SiC substrate 201 having a relatively high impurity concentration is prepared and an n-type (n$^-$-type) SiC drift layer 202 having a relatively low impurity concentration is subjected to epitaxial growth thereon (FIG. 11). Herein, the SiC drift layer 202 having a thickness of 5 to 15 μm is subjected to the epitaxial growth on the SiC substrate 201 having a thickness of 300 to 400 μm.

Figure 12:
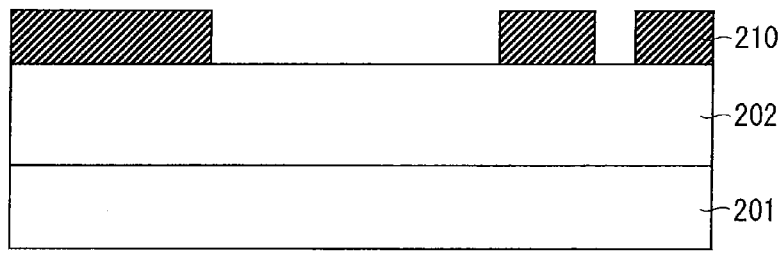
FIG. 12 is a view showing the process for manufacturing a semiconductor device according to the fourth embodiment of the present invention.

Subsequently, a photoresist is applied onto a surface of the SiC drift layer 202 and respective treatments, that is, heating, pattern transfer through photolithography, and development using an alkaline developing solution are then carried out in order. Consequently, there is formed a resist pattern 210 in which formation regions of a recess structure 207 and an alignment mark 208 are opened (FIG. 12). A height of the resist pattern 210 is set to be 3.7 to 5.3 μM.

In the present embodiment, the resist pattern 210 to be used should have a high rectangular property of a sectional shape (an angle formed by a side surface of the resist pattern 210 and the surface of the SiC drift layer 202 is nearly vertical).

As a material of the resist pattern 210, it is possible to use a positive photoresist containing a photosensitive material, a base resin, and an organic solvent as main components and having a relatively high rectangular property of a sectional shape obtained after etching, for example. The photoresist is used to carry out a heat treatment for 60 seconds at 110° C., a developing treatment for 100 seconds using, as an alkaline developing solution, a tetramethylammonium hydroxide 2.8 wt % solution and a washing treatment for 60 seconds with pure water. The resist pattern 210 obtained as a result has the side surface which forms an angle of approximately 88 degrees with respect to the surface of the SiC drift layer 202, and has a high rectangular property.

Figure 13:
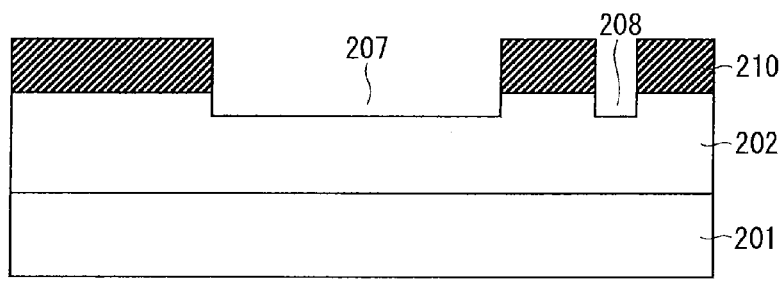
FIG. 13 is a view showing the process for manufacturing a semiconductor device according to the fourth embodiment of the present invention.

Subsequently, reactive ion etching (RIE) using the resist pattern 210 as a mask is carried out to simultaneously form the recess structure 207 and the alignment mark 208 which each have a depth of approximately 0.2 to 0.4 μm (FIG. 13).

As the condition of the RIE, for example, sulfur hexafluoride ($SF_6$) is used as an etching gas, a gas pressure is set to be 1 Pa, a gas flow rate is set to be 50 sccm, a high frequency power is set to be 800 W, and a substrate bias power is set to be 50 W. In this case, a ratio of an etching rate of a resist to an etching rate of SiC (an etching selection ratio) is approximately 0.5. In the present embodiment, the resist pattern 210 having a high rectangular property is used. Also in the case where the etching selection ratio is not high, therefore, it is possible to reduce a fluctuation in a pattern dimension which is caused by the etching.

Figure 14:
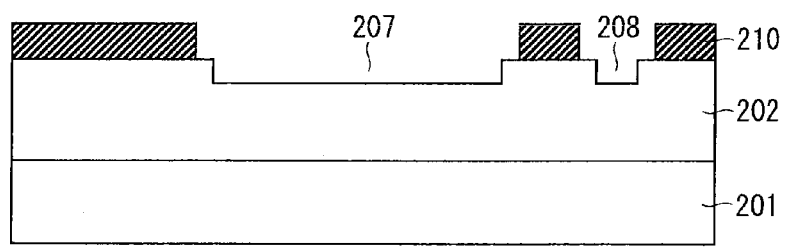
FIG. 14 is a view showing the process for manufacturing a semiconductor device according to the fourth embodiment of the present invention.

Thereafter, isotropic dry etching is carried out over the resist pattern 210 to reduce a width of the resist pattern 210 (to shrink) (FIG. 14). In other words, an opening of the resist pattern 210 is enlarged. Herein, the side surface of the resist pattern 210 is moved backward by approximately 0.3 to 0.6 μm by the dry etching. A height of the resist pattern 210 obtained after the shrinking treatment is approximately 3 to 4 μm.

As the condition of the etching, for example, oxygen ($O_2$) is used as an etching gas, a gas pressure is set to be 1 Pa, a gas flow rate is set to be 50 sccm, a high frequency power is set to be 800 W and a substrate bias power is set to be zero. The substrate bias power is set to be zero so that the isotropic dry etching is implemented.

Figure 15:
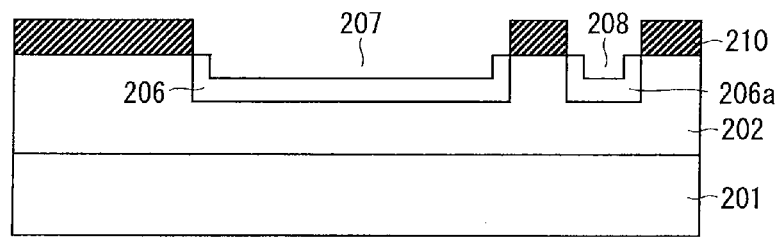
FIG. 15 is a view showing the process for manufacturing a semiconductor device according to the fourth embodiment of the present invention.

By ion implantation using the shrunk resist pattern 210 as a mask, Al ions to be p-type impurities are implanted into the SiC drift layer 202 to form a guard ring 206 (FIG. 15). The opening of the shrunk resist pattern 210 has a greater width than the recess structure 207. For this reason, the guard ring 206 is formed in an outer edge part of the recess structure 207 in addition to a bottom part thereof. In the case where the side surface of the resist pattern 210 is moved backward by approximately 0.3 to 0.6 μm by the shrinking treatment, the guard ring 206 is formed in extension to an outward region from the end of the recess structure 207 by approximately 0.3 to 0.6 μm.

Moreover, an opening is formed on the alignment mark 208 in addition to the recess structure 207 in the resist pattern 210. Therefore, the Al ions are also implanted into the alignment mark 208 portion (the bottom part and the outer edge part) so that an impurity region 206a is formed. When the Al ions are implanted into the alignment mark 208 portion, a light and shade is generated between the alignment mark 208 and a surrounding part thereof. Therefore, there is an advantage that a recognition rate of the alignment mark 208 can be enhanced in the case where a device for carrying out alignment by an image processing method is used.

Then, the resist pattern 210 is removed. The removal of the resist pattern 210 can be carried out by the same isotropic dry etching as described above. Furthermore, there is performed a heat treatment (activation annealing) at 1800 to 2000° C. for activating the implanted Al ions.

Figure 16:
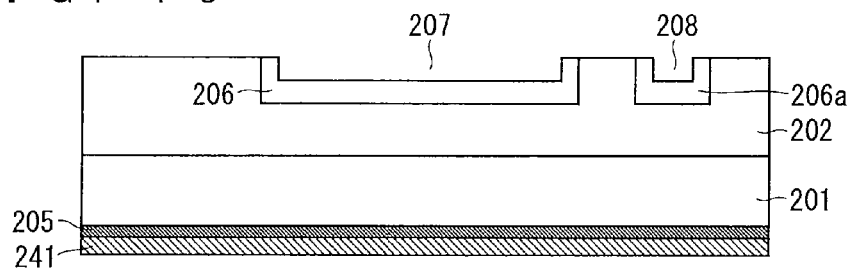
FIG. 16 is a view showing the process for manufacturing a semiconductor device according to the fourth embodiment of the present invention.

Subsequently, the nickel (Ni) layer 241 having a thickness of approximately 500 to 800 nm is formed on the back surface of the SiC substrate 201 by using a sputtering method, and RTA (Rapid Thermal Annealing) at approximately 1000° C. is carried out for about five minutes. As a result, the NiSi silicide layer 205 is formed on an interface between the SiC substrate 201 and the Ni layer 241 (FIG. 16).

Figure 17:
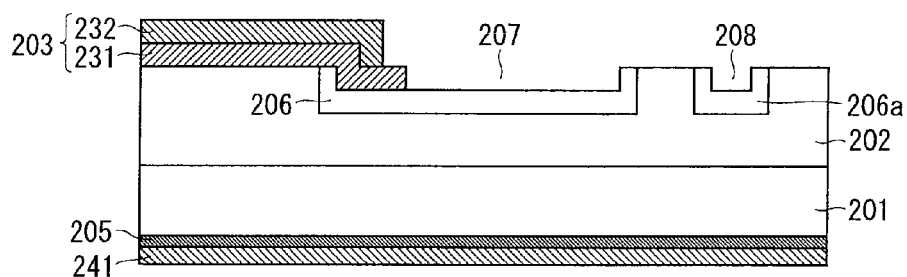
FIG. 17 is a view showing the process for manufacturing a semiconductor device according to the fourth embodiment of the present invention.

Moreover, the Ti layer 231 having a thickness of 100 to 300 nm is formed on the SiC drift layer 202 by using the sputtering method, and furthermore, the Al layer 232 having a thickness of 4.5 to 5.5 μm is formed on the Ti layer 231 so that the anode electrode 203 is formed (FIG. 17). In order to stabilize a height φB of a Schottky barrier (a difference between a work function of a metal and an electron affinity of a semiconductor), it is also possible to carry out a heat treatment at approximately 600° C. after formation of the Ti layer 231.

Finally, the Au layer 242 having a thickness of approximately 100 to 300 nm is formed on a lower surface of the Ni layer 241 by using the sputtering method. Consequently, a Schottky barrier diode having the structure shown in FIG. 10 is obtained.

As described above, in the present embodiment, the etching mask used for forming the recess structure 207 is shrunk to obtain an injection mask to be used for forming the guard ring 206. In other words, the recess structure 207 and the guard ring 206 having a greater width can be formed by using the same mask (the resist pattern 210). Accordingly, it is possible to further decrease the number of the masks as compared with the background art. In the present embodiment, particularly, the recess structure 207 and the alignment mark 208 are also formed by using the same mask (the resist pattern 210). Therefore, the structure in FIG. 10 can be formed by using only a single mask.

Although there is used the resist pattern 210 having the side surface which is substantially perpendicular to the surface of the SiC drift layer 202 in the present embodiment, moreover, it is also possible to use a resist pattern having an inclined side surface taking a taper shape. When the RIE is carried out by using the tapered resist pattern 210 as a mask, the respective shapes of the recess structure 207 and the alignment mark 208 are tapered in the same manner as in a fifth embodiment which will be described below.

D-2. Effects

According to the embodiment of the present invention, the method of manufacturing a semiconductor device further includes a step (c) of carrying out a shrinking treatment for a resist pattern between the step (b) of forming the recess structure 14 surrounding an element region on the n+ substrate 1 by using the resist pattern 13 and the step (d) of forming the guard ring injection layer 3 to be an impurity layer of a second conductivity type in the recess bottom surface 15 and the recess side surface 20 in the recess structure 14 by impurity injection through the resist pattern 13. By shrinking the etching mask used for the formation of the recess structure 207, consequently, it is possible to obtain the injection mask to be used for forming the guard ring 206, thereby decreasing the number of the masks to be required.

E. Fifth Embodiment

Figure 18:
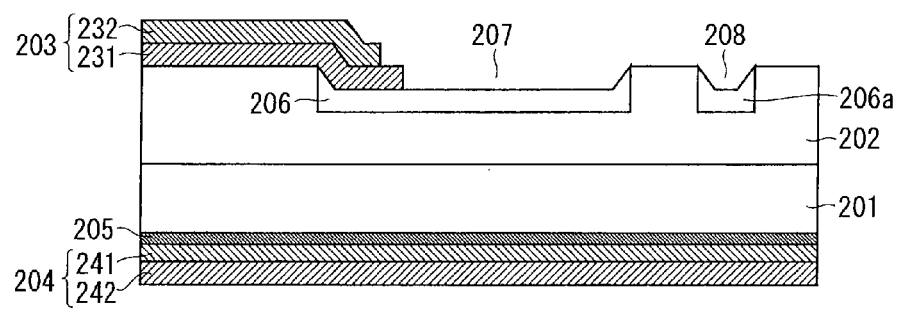
FIG. 18 is a view showing a structure of a semiconductor device according to a fifth embodiment of the present invention.
Figure 19:
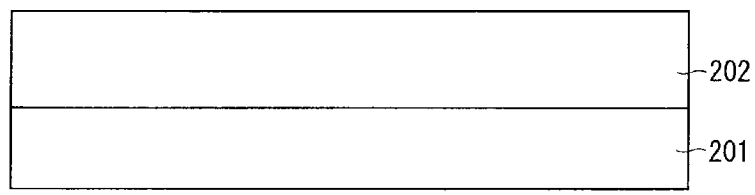
FIG. 19 is a view showing a process for manufacturing a semiconductor device according to the fifth embodiment of the present invention.

FIG. 18 is a view showing a structure of a termination region in a semiconductor device according to a fifth embodiment. In FIG. 17, elements having the same functions as those shown in FIG. 10 have the same reference numerals, and therefore, their detailed description will be omitted.

The semiconductor device in FIG. 18 is also a Schottky barrier diode formed by using SiC in the same manner as in FIG. 10, and a guard ring 206 is formed, as a termination structure, at an end of an anode electrode 203 thereof. However, the semiconductor device in FIG. 17 is different from that in FIG. 10 in that the respective shapes of the recess structure 207 and the alignment mark 208 are tapered with a larger width in upper parts than bottom parts.

FIGS. 19 to 24 are views showing steps in a method of manufacturing the Schottky barrier diode and the termination structure thereof illustrated in FIG. 17. Based on these drawings, a method of manufacturing a semiconductor device according to the present embodiment will be described below.

Figure 20:
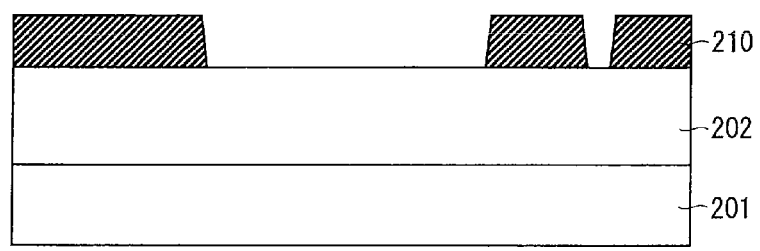
FIG. 20 is a view showing the process for manufacturing a semiconductor device according to the fifth embodiment of the present invention.

First of all, in the same manner as in the fourth embodiment, an n⁻-type SiC drift layer 202 is subjected to epitaxial growth over an n⁺-type SiC substrate 201 (FIG. 19), and a resist pattern 210 in which formation regions of a recess structure 207 and an alignment mark 208 are opened is formed on a surface of the SiC drift layer 202 (FIG. 20). Herein, a height of the resist pattern 210 is set to be 3.4 to 4.8 µm.

In the present embodiment, the resist pattern 210 to be used should take a taper shape having a smaller width in an upper part than a bottom part. An angle formed by a side surface of the resist pattern 210 and a surface of the SiC drift layer 202 is set to be around 80 degrees.

As a material of the resist pattern 210, it is possible to use a positive photoresist containing a photosensitive material, a base resin, and an organic solvent as main components and having a relatively low rectangular property of a sectional shape obtained after etching, for example. The photoresist is used to carry out a heat treatment for 60 seconds at 110° C., a developing treatment for 100 seconds using, as an alkaline developing solution, a tetramethylammonium hydroxide 2.8 wt % solution and a washing treatment for 60 seconds with pure water. The resist pattern 210 obtained as a result has the side surface which forms an angle of approximately 82 degrees with respect to the surface of the SiC drift layer 202.

Figure 21:
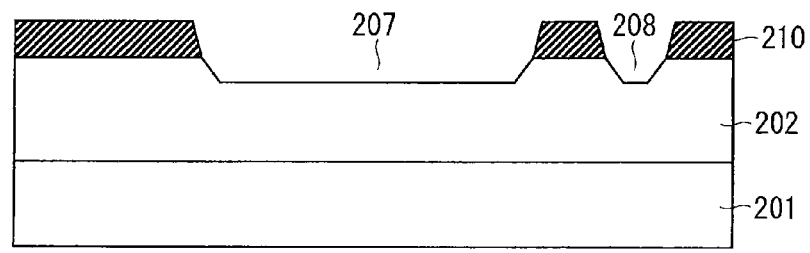
FIG. 21 is a view showing the process for manufacturing a semiconductor device according to the fifth embodiment of the present invention.

Subsequently, RIE using the resist pattern 210 as a mask is carried out to simultaneously form the recess structure 207 and the alignment mark 208 which each have a depth of approximately 0.2 to 0.4 µm (FIG. 21). As the condition of the RIE, for example, sulfur hexafluoride ($SF_6$) is used as an etching gas, a gas pressure is set to be 1 Pa, a gas flow rate is set to be 50 sccm, a high frequency power is set to be 800 W and a substrate bias power is set to be 50 W. In this case, a ratio of an etching rate of a resist to an etching rate of SiC (an etching selection ratio) is approximately 0.5.

In the present embodiment, the side surface of the tapered resist pattern 210 is inclined to some extent. In the RIE, therefore, the side surface of the resist pattern 210 is also subjected to the etching so that the resist pattern 210 is shrunk. On the conditions described above, when the recess structure 207 and the alignment mark 208 which each have a depth of approximately 0.2 to 0.4 µm are formed, the side surface of the resist pattern 210 is moved backward by approximately 0.4 to 0.8 µm in the meantime. In addition, the recess structure 207 and the alignment mark 208 are formed to be tapered. In each of the recess structure 207 and the alignment mark 208, a width of an inclination of an internal wall (a width in a radial direction of a recess) is substantially equal to a width of the backward movement of the resist pattern 210. Moreover, a height of the shrunk resist pattern 210 reaches approximately 3 to 4 µm.

Figure 22:
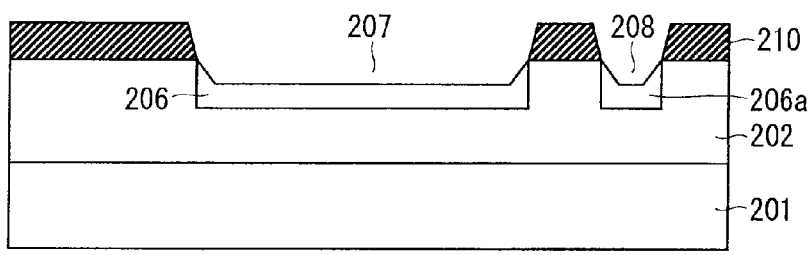
FIG. 22 is a view showing the process for manufacturing a semiconductor device according to the fifth embodiment of the present invention.

By ion implantation using the shrunk resist pattern 210 as a mask, Al ions to be p-type impurities are implanted into the SiC drift layer 202 to form a guard ring 206 (FIG. 22). An opening of the shrunk resist pattern 210 has a greater width than a bottom part of the recess structure 207. For this reason, the guard ring 206 is formed in an outer edge part, that is, an internal wall part of the recess structure 207 in addition to the bottom part thereof. In the case where the side surface of the resist pattern 210 is moved backward by approximately 0.4 to 0.8 µm by the shrinking treatment, the width of the inclination of the internal wall in the recess structure 207 is equal thereto. Therefore, the guard ring 206 is formed in extension to an outward region from the bottom end of the recess structure 207 by approximately 0.4 to 0.8 µm.

Also in the present embodiment, an opening is formed on the alignment mark 208 in addition to the recess structure 207 in the resist pattern 210. Therefore, an impurity region 206a is also formed in the alignment mark 208 portion (the bottom part and the inner wall part). Consequently, a light and shade is generated between the alignment mark 208 and a surrounding part thereof.

Then, the resist pattern 210 is removed. The removal of the resist pattern 210 is carried out by dry etching in which oxygen ($O_2$) is used as an etching gas, a gas pressure is set to be 1 Pa, a gas flow rate is set to be 50 sccm, and a high frequency power is set to be 800 W, for example. Then, activation annealing of Al ions is performed at 1800 to 2000° C.

Figure 23:
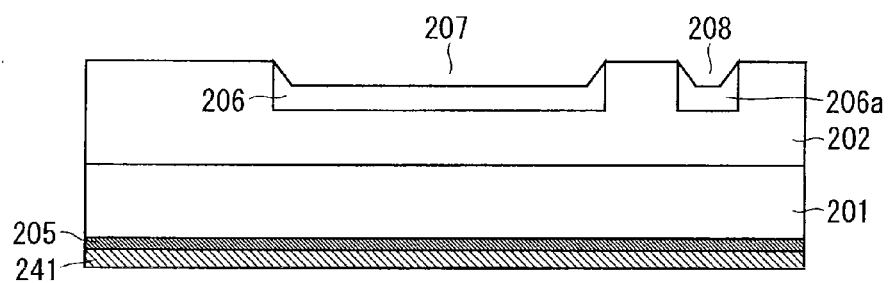
FIG. 23 is a view showing the process for manufacturing a semiconductor device according to the fifth embodiment of the present invention.
Figure 24:
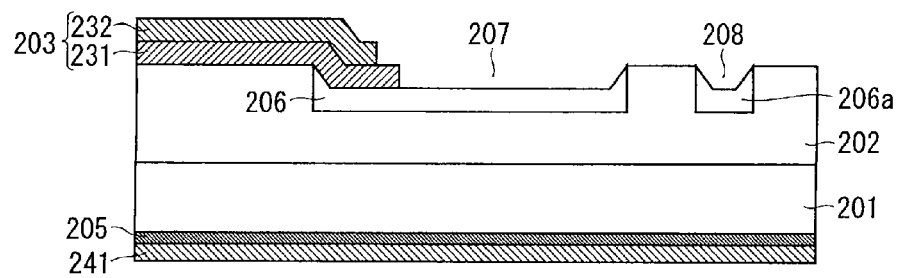
FIG. 24 is a view showing the process for manufacturing a semiconductor device according to the fifth embodiment of the present invention.

Subsequently, a nickel (Ni) layer 241 having a thickness of approximately 500 to 800 nm is formed on a back surface of the SiC substrate 201 by using a sputtering method, and RTA at approximately 1000° C. is carried out for approximately five minutes. As a result, an NiSi silicide layer 205 is formed on an interface between the SiC substrate 201 and the Ni layer 241 (FIG. 23).

In the same manner as in the fourth embodiment, then, a Ti layer 231 and an Al layer 232 are sequentially formed on the SiC drift layer 202 (FIG. 24) and an Au layer 242 is formed on a lower surface of the Ni layer 241. Consequently, a Schottky barrier diode having the structure shown in FIG. 18 is obtained.

As described above, in the present embodiment, the etching mask used for forming the recess structure 207 is shrunk to obtain an injection mask to be used for forming the guard ring 206 in the same manner as in the fourth embodiment. In other words, the recess structure 207 and the guard ring 206 having a greater width can be formed by using the same mask (the resist pattern 210). In addition, the shrinkage of the resist pattern 210 is executed by the etching for forming the recess structure 207. For this reason, an individual process for shrinking the resist pattern 210 is not required. Therefore, it is possible to further decrease the number of the steps as compared with the fourth embodiment.

Although there is used the resist pattern 210 which has an inclined side surface taking a taper shape from the beginning in the present embodiment, it is also possible to use a resist pattern (a vertical resist) having a side surface in formation which is substantially perpendicular to the surface of the SiC drift layer 202. In the RIE forming the recess structure 207, if an oxygen gas is add or a pressure is changed to increase isotropy of the etching, the vertical resist becomes tapered during the execution of the RIE.

According to the embodiment of the present invention, in the method of manufacturing a semiconductor device, the step (b) of forming the recess structure 207 surrounding an element region on the Sic substrate 201 by using the resist pattern 210 is a step of forming the recess structure 207 while shrinking the resist pattern 210 taking a taper shape at the end by using the resist pattern 210. Consequently, the corner of the recess structure 207 is changed to have an obtuse angle. Thus, it is possible to prevent electric field concentration into the corner.

F. Sixth Embodiment

Although the example in which the present invention is applied to the guard ring forming step has been described in the fourth and fifth embodiments, the present invention can also be applied to the formation of FLR.

Figure 25:
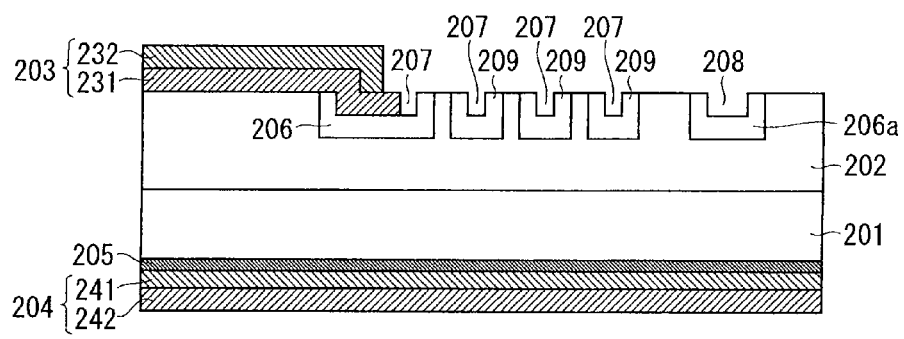
FIG. 25 is a view showing a structure of a semiconductor device according to a sixth embodiment of the present invention.
Figure 26:
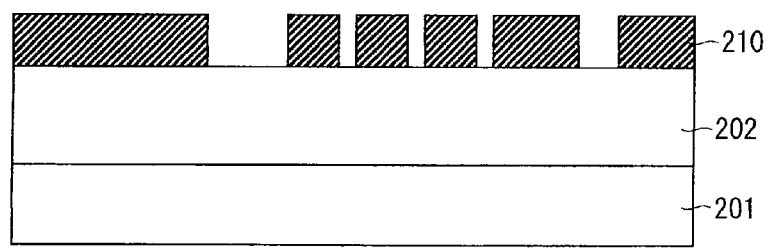
FIG. 26 is a view showing a process for manufacturing a semiconductor device according to the sixth embodiment of the present invention.
Figure 27:
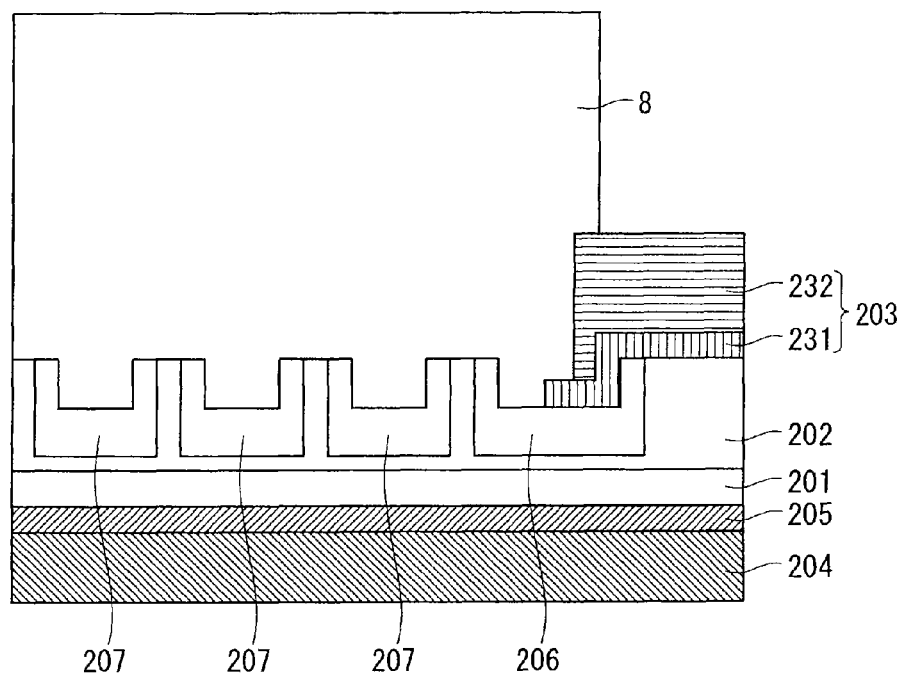
FIG. 27 is a sectional view showing the structure of the semiconductor device according to the sixth embodiment of the present invention.

FIG. 25 is a view showing a structure of a termination region of a Schottky barrier diode having the FLR as a termination structure. The FLR basically has the same structure as a guard ring except that it is constituted by a plurality of p-type impurity regions 206a having an equal impurity concentration. If a plurality of ring-shaped openings is formed on the resist pattern 210 at an equal interval or with an interval increased toward an outer periphery as shown in FIG. 26 at the step of forming the resist pattern 210 according to the fourth or fifth embodiment (FIG. 12 or FIG. 20), accordingly, it is possible to form the FLR. Since the other steps may be the same as those in the fourth or fifth embodiment, description will be omitted. In this case, a semiconductor device 300 shown in FIG. 27 is completed.

Although the Schottky barrier diode has been illustrated as the semiconductor element in the above description, moreover, the present invention can also be applied to a termination structure such as an MOSFET.

While the invention has been shown and described in detail, the foregoing description is in all aspects illustrative and not restrictive. The present invention is not restricted to the material quality, the materials, the execution conditions and the like of the respective components which are described, for example. It is therefore understood that numerous modifications and variations can be devised without departing from the scope of the invention.

EXPLANATION OF LETTERS OR NUMERALS 1, 101: n+ substrate, 2: n-type epitaxial layer, 3, 103: guard ring injection layer, 5, 6, 105, 106: metal layer, 7, 107: surface electrode, 8, 108: polyimide, 9, 109: back electrode, 13, 210: resist pattern, 14, 207: recess structure, 15: recess bottom face, 16: FLR injection layer, 17: low concentration impurity implantation layer, 18: high concentration impurity implantation layer, 20: recess side surface, 21: corner portion, 100, 200, 300: semiconductor device, 104: JTE injection layer, 110: thermal oxide film, 111: ohmic anneal, 112: Ti sintcr, 113: resist retreat. 201: SiC substrate, 202: SiC drift layer, 203: anode electrode, 204: cathode electrode, 205: silicide layer, 206: guard ring, 206a: impurity region, 208: alignment mark, 231: Ti layer, 232: Al layer, 241: Ni layer, 242: Au layer.

The invention claimed is:

1. A method of manufacturing a semiconductor device, comprising:
    (a) preparing a ground constituted by a silicon carbide semiconductor of a first conductivity type;
    (b) forming a recess structure surrounding an element region on said ground by using a resist pattern;
    (c) carrying out a shrinking treatment over said resist pattern after said (b); and
    (d) forming an impurity layer of a second conductivity type in a recess bottom surface and a recess side surface in said recess structure by impurity injection using said resist pattern moved backward through said shrinking treatment as a mask after said (c) carrying out,
    wherein a corner portion of said recess structure is covered with said impurity layer.

2. The method of manufacturing a semiconductor device according to claim 1, wherein said (c) carrying out carries out said shrinking treatment through isotropic etching over said resist pattern.

3. The method of manufacturing a semiconductor device according to claim 1, wherein a side surface of said resist pattern and said ground are substantially perpendicular to each other in formation of said resist pattern.

4. The method of manufacturing a semiconductor device according to claim 1, wherein a side surface of said resist pattern is moved backward by 0.3 to 0.6 µm through said shrinking treatment.

5. The method of manufacturing a semiconductor device according to claim 1, wherein said (b) forming forms said recess structure taking a taper shape on said recess side surface by using said resist pattern taking a taper shape at an end.

6. The method of manufacturing a semiconductor device according to claim 1, wherein said (d) forming forms said impurity layer constituted by a low concentration impurity layer and a high concentration impurity layer of a second conductivity type through said impurity injection in two stages.

7. The method of manufacturing a semiconductor device according to claim 5, wherein said (b) forming forms said recess structure in which a depth of said recess is equal to or greater than 0.1 µm and a width of said taper shape is equal to or greater than 0.2 µm.

8. The method of manufacturing a semiconductor device according to claim 5, wherein said (b) forming forms said recess structure having a corner portion in which a radius of curvature is equal to or greater than 0.1 µm.

9. The method of manufacturing a semiconductor device according to claim 1, wherein said (b) forming simultaneously forms an alignment mark in addition to said recess structure.

10. The method of manufacturing a semiconductor device according to claim 1, wherein said (d) forming forms a guard ring layer of a second conductivity type or a field limiting ring layer of a second conductivity type as said impurity layer.

11. The method of manufacturing a semiconductor device according to claim 1, wherein said (b) forming forms a plurality of said recess structures surrounding an element region on said ground by using the resist pattern, and said (b) forming forms a plurality of said recess structures such that an interval between said recess structures is increased toward an outer periphery of said element region.

12. The method of manufacturing a semiconductor device according to claim 1, further comprising (e) forming a Schottky electrode in at least a part of an inner portion of said recess structure after said (b) forming.

* * * * *